(12) United States Patent
Kim

(10) Patent No.: US 10,692,686 B2
(45) Date of Patent: Jun. 23, 2020

(54) SURFACE TREATMENT APPARATUS USING PLASMA

(71) Applicant: JEHARA CORPORATION, Gyeonggi-do (KR)

(72) Inventor: Hongseub Kim, Gyeonggi-do (KR)

(73) Assignee: Jehara Corporation, Gyeonggi-Do (KR)

( * ) Notice: Subject to any disclaimer, the term of this patent is extended or adjusted under 35 U.S.C. 154(b) by 525 days.

(21) Appl. No.: 15/655,548

(22) Filed: Jul. 20, 2017

(65) Prior Publication Data

US 2018/0114676 A1 Apr. 26, 2018

(30) Foreign Application Priority Data

Oct. 21, 2016 (KR) .................. 10-2016-0137499

(51) Int. Cl.
*C23C 16/00* (2006.01)
*H01J 37/02* (2006.01)
*H01J 37/32* (2006.01)

(52) U.S. Cl.
CPC ........ *H01J 37/026* (2013.01); *H01J 37/3244* (2013.01); *H01J 37/32082* (2013.01); *H01J 37/32834* (2013.01); *H01J 2237/0041* (2013.01); *H01J 2237/334* (2013.01)

(58) Field of Classification Search
CPC .................................................. H01J 37/026
See application file for complete search history.

(56) References Cited

U.S. PATENT DOCUMENTS

| | | | | |
|---|---|---|---|---|
| 6,184,625 | B1* | 2/2001 | Ogura | H01J 27/18 118/723 ME |
| 2005/0189482 | A1* | 9/2005 | Yeom | H05H 3/02 250/251 |
| 2006/0180082 | A1* | 8/2006 | Iwamoto | C23C 16/45527 118/724 |

FOREIGN PATENT DOCUMENTS

| | | |
|---|---|---|
| JP | 2001164371 A | 6/2001 |
| KR | 10-2003-0042958 A | 6/2003 |
| KR | 1020040033524 A | 4/2004 |
| KR | 1020080061807 A | 7/2008 |
| KR | 10-2015-0097957 A | 8/2015 |
| KR | 1020160106920 A | 9/2016 |
| WO | 2011/105898 A1 | 9/2011 |

\* cited by examiner

*Primary Examiner* — Keath T Chen
(74) *Attorney, Agent, or Firm* — HoustonHogle LLP

(57) ABSTRACT

The present invention relates to a surface treatment apparatus for cleaning or treating (micro etching, etc.) a surface of a TEM sample (substrate) by converting plasma ions into a neutral beam and a separator including an RF cathode connected to an RF supply unit and accelerating ions by self bias is disposed between a plasma generating chamber and a neutral chamber and the ions generated in the plasma generating chamber are converted into a neutral beam through a separator and accelerated and irradiated to a neutral chamber to enable surface treatment without damaging a sample.

11 Claims, 4 Drawing Sheets

SURFACE TREATMENT APPARATUS USING PLASMA

RELATED APPLICATIONS

This application claims priority to Korean Patent Application No. 10-2016-0137499, filed on Oct. 21, 2016, which is incorporated herein by reference in its entirety.

BACKGROUND OF THE INVENTION

Transmission electron microscopy (TEM) represents a high-precision electron microscopy technique capable of observing a structure of an atomic layer of a sample. In order to observe the atomic layer by means of the TEM, the sample needs to be manufactured to be thin, with a thickness of several nanometers (nm) so that electrons penetrate a cross section of the sample. Ion milling has been mainly used in the related art as such a method for manufacturing the sample, but the ion milling has many difficulties due to high price and damages to the sample. There is difficulty in lowering ion energy for the ion milling without damaging the sample and focusing an ion beam onto a very small sample.

Korean Patent Unexamined Publication No. 2003-0042958 (published date: Jun. 2, 2003) and Korean Patent Registration No. 10-0559245 (Publication date: Mar. 15, 2006) concern microsopy systems.

SUMMARY OF THE INVENTION

The present invention relates to a surface treatment apparatus for cleaning a surface of a transmission electron microscopy (TEM) sample (substrate) or performing surface treatment (micro etching, etc.) using a plasma.

The present invention has been made in an effort to provide a surface treatment apparatus of a TEM sample by effectively converting plasma ions into a neutral beam. Since a surface is etched with a low-energy neutral beam, damage to a sensitive sample may be minimized.

In order to achieve such an object, a surface treatment apparatus using a plasma according to the present invention includes: a process gas supply unit capable of singly or mixedly supplying two or more process gases; a plasma generating chamber injected with supply gas from the process gas supply unit to generate the plasma; a neutral chamber having a vacuum pump to process a surface of a sample by a neutral beam in a vacuum atmosphere; and a separator provided between the plasma generating chamber and the neutral chamber for converting ions generated by the plasma generating chamber into a neutral beam and transferring the neutral beam to the neutral chamber. The separator includes an RF cathode, an insulator, and a neutralizer. The radio frequency (RF) cathode has a plate shape having a plurality of first gas holes is connected with an RF supply unit, and accelerates the ions by self bias. The insulator is stacked below the RF cathode and has a plurality of second gas holes which are in communication with the first gas holes. The neutralizer converts the ions into the neutral beam, is stacked below the insulator and has a plurality of third gas holes which are in communication with the second gas holes.

Preferably, the neutral chamber and/or the plasma generating chamber further includes one or more sample holding units fixing and supporting the sample in each of the neutral chamber and the plasma generating chamber.

More preferably, the sample holding unit includes a sample fixing unit at which the sample is seated and positioned, a holder bracket supporting the sample fixing unit to move forwards and backwards and rotate, an operation unit operating the sample fixing unit forwards and backwards, and a rotation operating unit rotating and driving the sample fixing unit.

Preferably, the process gas may be Ar, $O_2$, $N_2$, or $H_2$, or mixed gas thereof for removing organic contamination or the process gas may be reacted gas of $CF_4$, $SF_6$, $Cl_2$, or $CHF_3$ or mixed gas thereof in order to remove metallic or inorganic contaminants.

Preferably, the neutralizer may be a metallic material such as Al or Al coated with gold (Au), etc. or a non-metallic conductive material such as carbon, etc.

Preferably, the surface treatment apparatus using a plasma further includes an exhaust gas processing unit connected to the vacuum pump and processing noxious gas in exhaust gas and more preferably, the exhaust gas processing unit includes a capturing unit for capturing the exhausted noxious gas, and a gas detection sensor provided in an exhaust line of the capturing unit and detecting a concentration of the noxious gas.

Preferably, the third gas hole may include a resistance section having an inverted conical shape on the top thereof, and a cylindrical vent section extending from the bottom of the resistance section.

More preferably, a height of the resistance section may be longer than the height of the vent section or the height of the resistance section may be equal to or shorter than the height of the vent section.

In a plasma generating apparatus of the present invention, a separator including an RF cathode connected to an RF supply unit and accelerating ions by self bias is disposed between a plasma generating chamber and a neutral chamber and the ions generated in the plasma generating chamber are converted into a neutral beam through a separator and accelerated and irradiated to a neutral chamber to enable surface treatment without damaging a sample.

In addition, in a surface treatment apparatus using a plasma according to the present invention, metallic or inorganic pollutants contaminating the sample when a neutral radical is used by using gases such as $CF_4$ and $Cl_2$ and various kinds of carbon-based organic pollutants contaminated on a surface of the sample can be effectively removed when $O_2$, $H_2$ and Ar radicals are used.

Further, a plasma technique used in the present invention has an advantage in that it does not require a focused beam as is used in ion milling, but a diffusion beam can be used.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Specific structural or functional descriptions presented in embodiments of the present invention are made only for the purposes of describing the embodiments according the concept of the present invention and the embodiments according to the concept of the present invention may be carried out in various forms. Further, it should not be construed that the present invention is limited to the embodiments described in the present specification and it should be understood that the present invention covers all the modifications, equivalents and replacements included within the idea and technical scope of the present invention.

Meanwhile, in the present invention, terms including first and/or second, and the like are used for describing various constituent elements, but the constituent elements are not limited by the terms. The terms may be used only for a purpose of distinguishing one component from another component and for example, a first component may be referred to as a second component, and similarly, the second component may be referred to even as the first component within a range without departing from the scope of the present invention, according to a concept of the present invention.

It should be understood that, when it is described that a component is "connected to" or "accesses" another component, the component may be directly connected to or access the other component or a third component may be present therebetween. In contrast, it should be understood that, when it is described that an element is "directly connected to" or "directly contacts" another element, it is understood that no element is present between the element and another element. Meanwhile, other expressions describing the relationship of the components, that is, expressions such as "between" and "directly between" or "adjacent to" and "directly adjacent to" should be similarly interpreted.

Terms used in the present specification are used only to describe specific embodiments, and are not intended to limit the present invention. A singular form may include a plural form if there is no clearly opposite meaning in the context. In the present specification, it should be understood that the terms "include" or "have" indicates that a feature, a number, a step, an operation, a component, a part or the combination thereof which are implemented, are present but does not exclude a possibility of presence or addition of one or more other features, numbers, steps, operations, components, parts or combinations thereof, in advance.

Hereinafter, a detailed embodiment of the present invention will be described with reference to the accompanying drawings.

Figure 1:
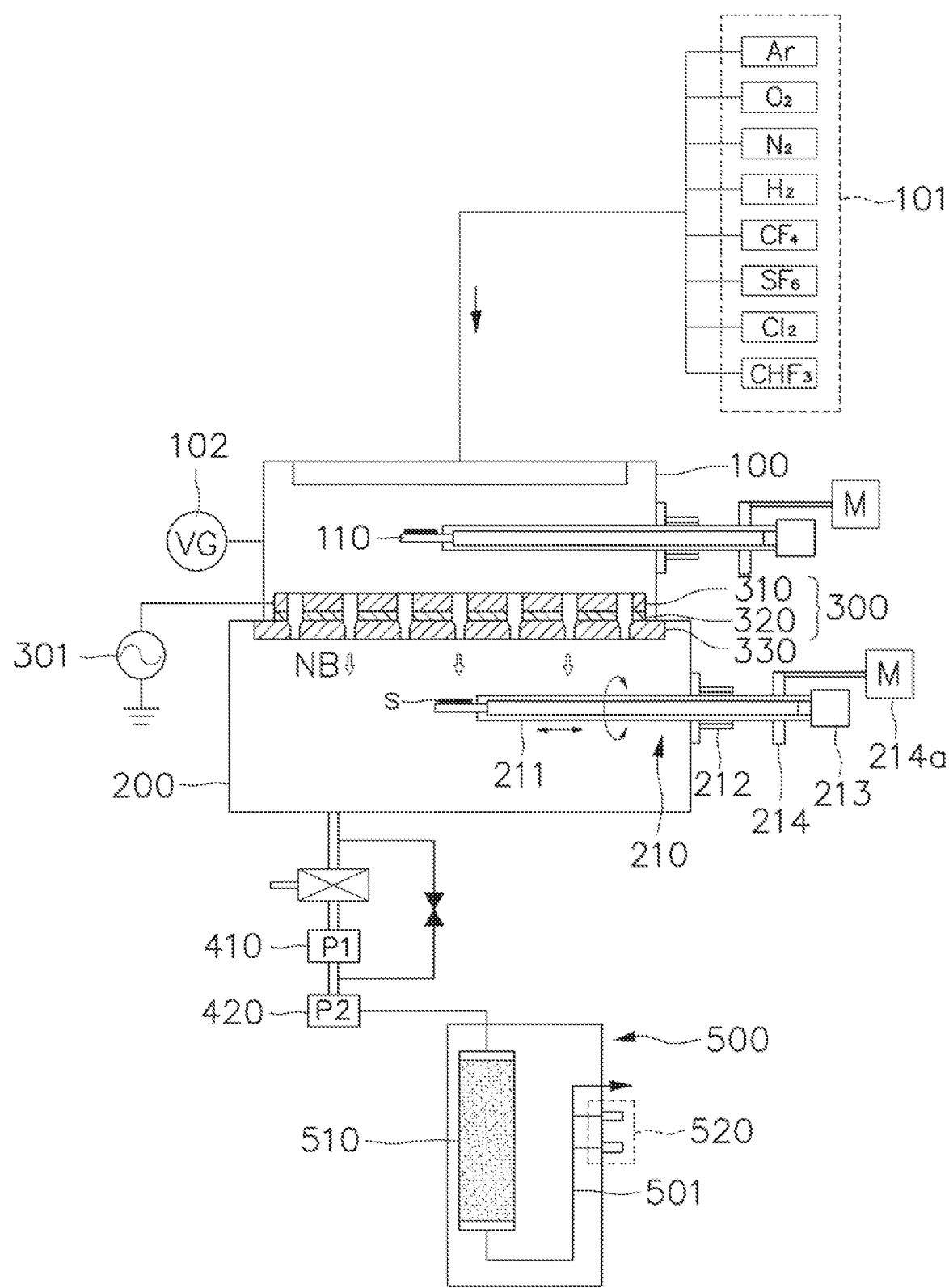
FIG. 1 is an overall configuration diagram of a surface treatment apparatus using a plasma according to the present invention.

FIG. 1 is an overall configuration diagram of a surface treatment apparatus using a plasma, according to the present invention.

Referring to FIG. 1, the surface treatment apparatus using a plasma according to the present invention includes a plasma generating chamber 100, a neutral chamber 200 disposed below the plasma generating chamber 100, and a separator 300 disposed between the plasma generating chamber 100 and the neutral chamber 200 and may further include an exhaust gas processing unit for processing noxious gas in exhaust gas in connection to vacuum pumps 410 and 420 for generating vacuum in connection to the neutral chamber 200.

The plasma generating chamber 100 includes a process gas supply unit 101 supplying process gas to generate the plasma and includes a mass flow controller (MFC) (not illustrated) to supply a predetermined amount of process gas. As the process gas, known Ar, $O_2$, $N_2$, and $H_2$ may be used or $CF_4$, $SF_6$, $Cl_2$, $CHF_3$, etc., or mixed gas thereof, may be used in order to remove metallic or inorganic contaminants of a sample.

Reference numeral 102 represents a vacuum gauge which may display a vacuum degree.

The neutral chamber 200 treats a surface of a sample (substrate) S and preferably further includes a first sample holding unit 210 which fixes and supports the sample.

The first sample holding unit 210 may include a sample fixing unit 211 at which the sample S is seated and positioned, a holder bracket 212 supporting the sample fixing unit 211 to move forwards and backwards and rotate in the neutral chamber 200, an operation unit 213 operating the sample fixing unit 211 forwards and backwards, and a rotation operating unit 214 rotating and driving the sample fixing unit 211. The rotation operating unit 214 includes an electric motor 214a to be driven in a motorized manner.

Although not illustrated, the sample fixing unit 211 includes a mechanical clamp or a vacuum chuck in a fixation part at which the sample S is seated and positioned to fix the sample S in the sample fixing unit 211.

In the embodiment, it is illustrated that the plasma generating chamber 100 includes a second sample holding unit 110, and as a result, the surface of the sample may be treated by the plasma generated in the plasma generating chamber 100.

Figure 2:
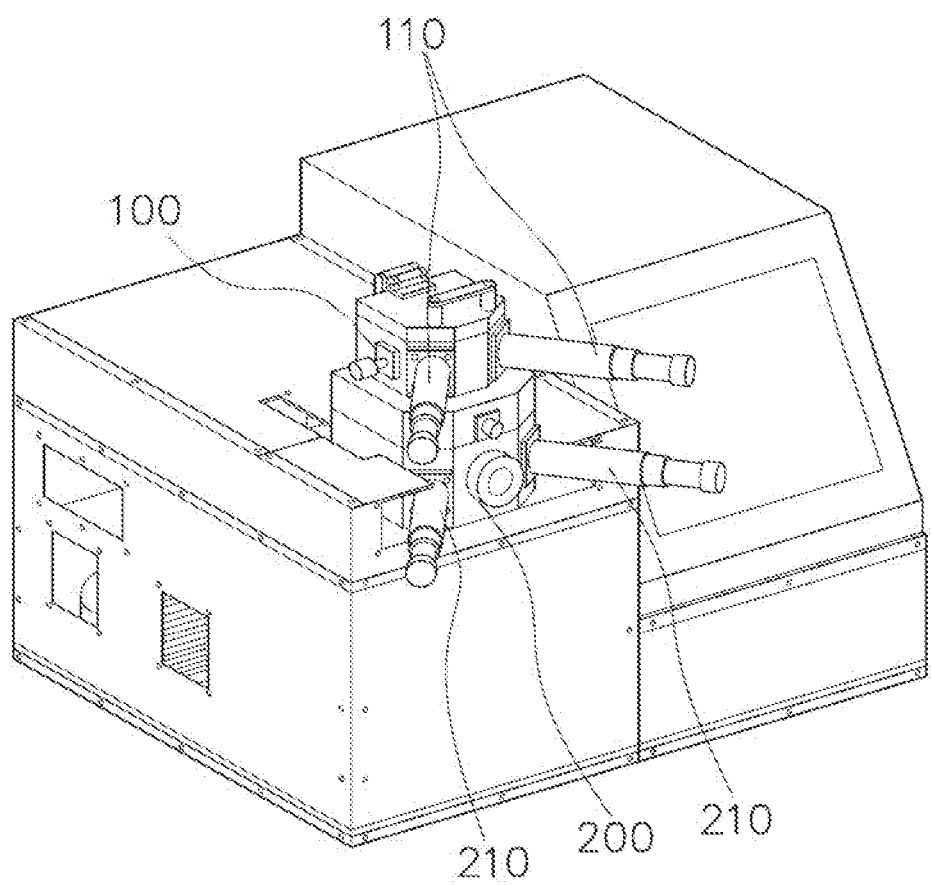
FIG. 2 is a diagram illustrating an embodiment of the surface treatment apparatus using a plasma according to the present invention.

FIG. 2 is a diagram illustrating an embodiment of the surface treatment apparatus using a plasma according to the present invention.

Referring to FIG. 2, it is illustrated that the neutral chamber 200 and the plasma generating chamber 100 include the first sampling unit 210 and the second sample holding unit 110, respectively, and in this case, each chamber includes two sample holding units to treat the surfaces of a plurality of samples. Two or more sample holding units provided in each chamber may be provided according to a size or a shape of the chamber.

Referring back to FIG. 1, the vacuum pumps 410 and 420 are provided on the bottom of the neutral chamber 200, and in the embodiment, it is illustrated that the vacuum pumps 410 and 420 include a high-vacuum pump 410 for high vacuum and a low vacuum pump 420 for low vacuum. During a vacuum process of the neutral chamber 200, the vacuum is initially generated up to a predetermined level by the low vacuum pump 420 and thereafter, a high vacuum state is generated by the high vacuum pump 410 to maintain a vacuum state.

The exhaust gas processing unit 500 is provided at discharge ends of each of the vacuum pumps 410 and 420 to capture and process reacted noxious process gas.

In detail, the exhaust gas processing unit 500 may include a noxious gas capturing unit 510 for capturing the noxious gas and a gas detection sensor 520 provided in an exhaust line 501 of the noxious gas capturing unit 510 to detect a concentration of the noxious gas. The noxious gas capturing unit 510 may be a known filter which may collect the generated noxious gas and may be, for example, a filter cartridge in which a resin is filled in order to capture the noxious gas, but is not limited thereto.

The separator 300 is disposed between the plasma generating chamber 100 and the neutral chamber 200 and converts ions generated by the plasma generating chamber 100 into a neutral beam NB and transfers the neutral beam NB to the neutral chamber 200.

In particular, in the present invention, the separator 300 as a plate shape having a plurality of first gas holes includes: an RF cathode 310 to which power is applied by self bias in connection with an RF supply unit 301; an insulator 320 having a plurality of second gas holes which is in communication with the first gas holes and stacked below the RF cathode 310; and a neutralizer 330 having a plurality of third gas holes which is in communication with the second gas holes, stacked below the insulator 320, and converting the ions into the neutral beam.

Figure 3:
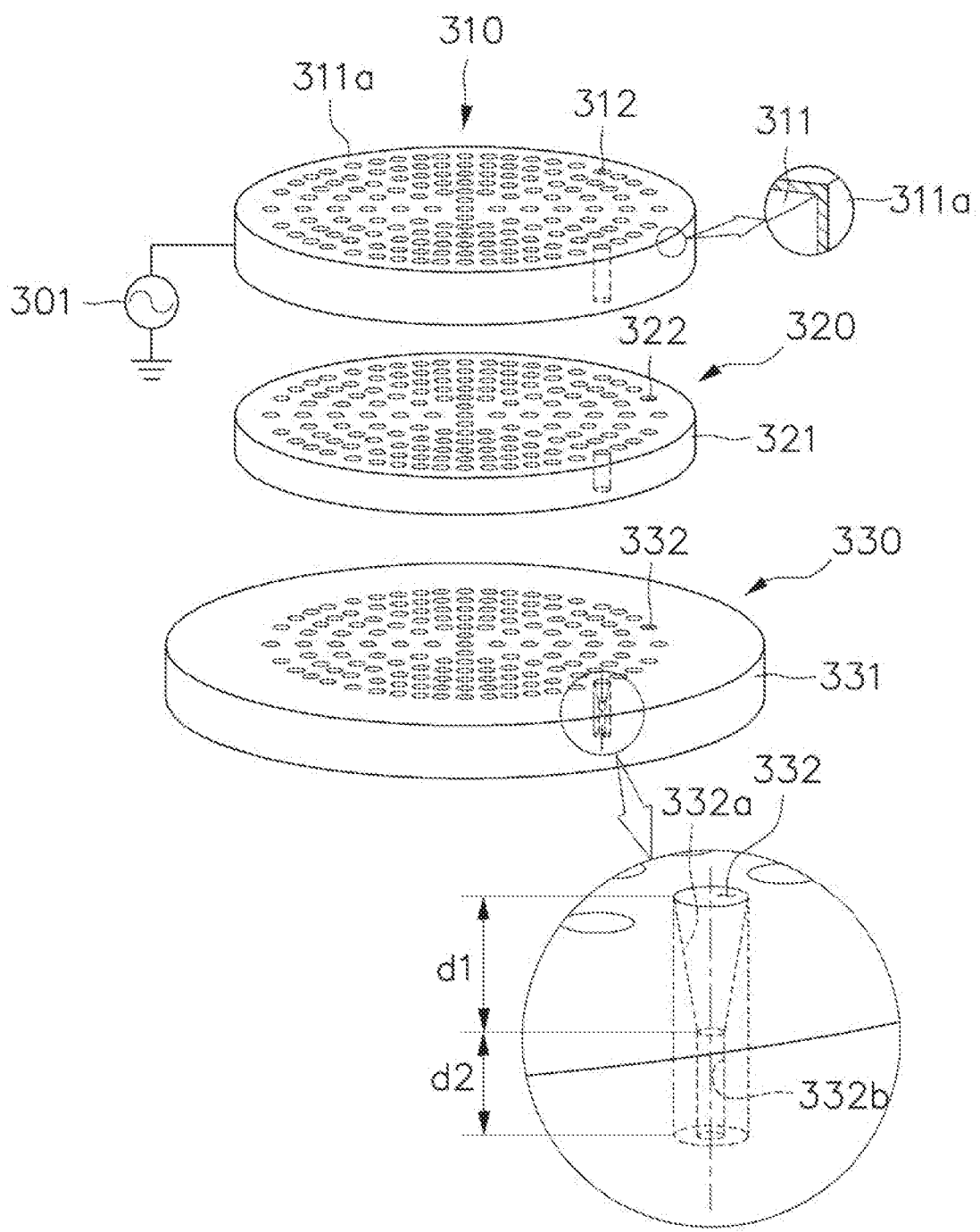
FIG. 3 is an exploded perspective view of a separator which is a primary component of the surface treatment apparatus using a plasma according to the present invention.

FIG. 3 is an exploded perspective view of a separator 300 which is a primary component of the surface treatment apparatus using a plasma according to the present invention and a partially enlarged diagram illustrates a state in which a part of an insulating film 311a is cut out.

Referring to FIG. 3, the RF cathode 310 includes a disk-shaped cathode body 311 of a conductor having a plurality of gas holes 312 which is vertically pierced and preferably, the insulating film 311a such as anodizing, etc., is coated on the surface of the disk body 311.

The RF cathode 310 is connected with the RF supply unit 301 and the ions are accelerated by the self bias.

The insulator 320 includes a disk-shaped insulating body 321 having a plurality of second gas holes 322 which is pierced and in this case, the second gas hole 322 is formed at a location corresponding to the first gas hole 312.

The neutralizer 330 may adopt a metallic material such as Al or Al coated with gold (Au), etc. or a non-metallic conductive material such as carbon, etc., and a plurality of third gas holes 332 includes a disk-shaped neutralizer body 331. The third gas hole 332 is formed at the location corresponding to the second gas hole 322.

Preferably, the third gas hole may be constituted by a resistance section 332a having an inverted conical slope on the top thereof and a cylindrical vent section 332b extending from the bottom of the resistance section 332a, therefore, a probability that the ions passing through the third gas holes 332 will collide with the slope in the resistance section 332a, and as a result, more neutral beams may be obtained.

Meanwhile, when a height d1 of the resistance section 332a constituting the third gas hole 332 is longer than a height d2 of the vent section 332b (d1>d2), the neutral beam which is exhausted along the third gas hole 332 has a diffusion beam and when the vent section 332b is longer than the resistance section 332a (d1<d2) and lengths of both sections are substantially the same as each other (d1≈d2), the neutral beam which is exhausted along the third gas hole 332 is exhausted in a direct direction, and as a result, the neutral beam may be irradiated only to a local space in the neutral chamber.

Therefore, a diffusion neutral beam which is appropriate to processing of the sample may be obtained by appropriately adjusting a ratio (d1:d2) of the lengths of the resistance section 332a and the vent section 332b.

In the separator configured as such, a hole is formed, in which the first gas hole 312, the second gas hole 322, and the third gas hole 332 are connected into one and the ions in the plasma generating chamber move to the separator and pass through the hole to be neutralized and transported to the neutral chamber 200 by the self bias applied to the RF cathode 310 by the RF supply unit 301.

Figure 4A:
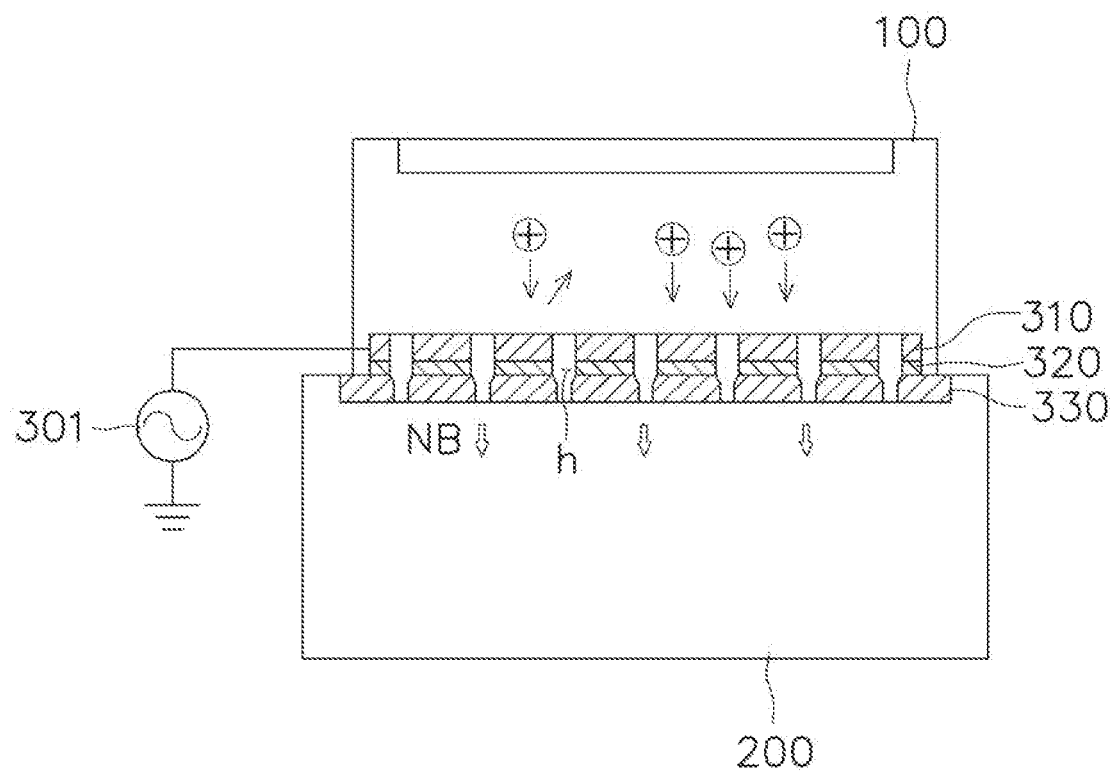
FIGS. 4A and 4B are a schematic configuration diagram of the surface treatment apparatus using a plasma and a graph showing a vertical potential distribution according to the present invention, respectively.
Figure 4B:
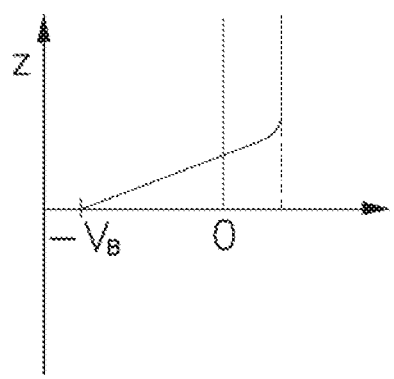

FIGS. 4A and 4B are a schematic configuration diagram of the surface treatment apparatus using a plasma and a graph showing a vertical potential distribution according to the present invention, respectively. Each gas hole that pierces the RF cathode 310, the insulator 320, and the neutralizer 330 is referred to as a hole h.

Referring to FIGS. 4A and 4B, the plasma generated by the plasma generating chamber 100 has a positive (+) potential, while the plasma has a negative (−) potential on the surface of the RF cathode 310 by the self bias ($-V_B$) of the RF supply unit 301.

Therefore, positive ions of the plasma generating chamber 100 are accelerated by the RF cathode 310, the accelerated positive ions are neutralized while passing through the hole h, and a plasma density in the hole h is increased by a hollow cathode effect. The neutral beam passing through the hole h is irradiated to the neutral chamber 200 to treat the surface of the sample.

The aforementioned present invention is not limited to the aforementioned embodiments and the accompanying drawings, and it will be obvious to those skilled in the technical field to which the present invention pertains that various substitutions, modifications, and changes may be made within the scope without departing from the technical spirit of the present invention.

What is claimed is:

1. A surface treatment apparatus, comprising:
a process gas supply for supplying gases;
a plasma generating chamber injected with the gases from the process gas supply to generate a plasma;
a neutral chamber in which a surface of a sample is treated by a neutral beam; and
a separator provided between the plasma generating chamber and the neutral chamber for converting ions generated by the plasma generating chamber into the neutral beam and transferring the neutral beam to the neutral chamber,
wherein the separator includes
a radio frequency cathode for accelerating the ions, wherein the radio frequency cathode has a plate having a plurality of first gas holes, and is connected with a radio frequency supply,
an insulator that is stacked below the radio frequency cathode and has a plurality of second gas holes, which are in communication with the first gas holes, and
a neutralizer for converting the ions into the neutral beam, wherein the neutralizer is stacked below the insulator and has a plurality of third gas holes which are in communication with the second gas holes; and
one or more sample holding units fixing and supporting the sample in each of the neutral chamber and the plasma generating chamber.

2. A surface treatment apparatus using a plasma, the apparatus comprising:
a process gas supply capable of singly or mixedly supplying two or more process gases;

a plasma generating chamber injected with supply gas from the process gas supply to generate the plasma;

a neutral chamber having a vacuum pump to treat a surface of a sample by a neutral beam in a vacuum atmosphere; and a separator provided between the plasma generating chamber and the neutral chamber and converting ions generated by the plasma generating chamber into the neutral beam and transferring the neutral beam to the neutral chamber, wherein the separator includes an RF cathode for accelerating the ions by self bias, wherein the RF cathode has a plate shape having a plurality of first gas holes, and is connected with an RF supply, an insulator that is stacked below the RF cathode and has a plurality of second gas holes, which are in communication with the first gas holes, and a neutralizer for converting the ions into the neutral beam, wherein the neutralizer is stacked below the insulator and has a plurality of third gas holes which are in communication with the second gas holes; and one or more sample holding units fixing and supporting the sample in each of the neutral chamber and the plasma generating chamber.

3. The surface treatment apparatus of claim 2, wherein each of the one or more sample holding units includes a sample fixing unit at which the sample is seated and positioned, a holder bracket supporting the sample fixing unit to move forwards and backwards and rotate, a rotation operating unit rotating and driving the sample fixing unit, and the sample fixing unit is capable of moving forwards and backwards.

4. The surface treatment apparatus of claim 2, wherein the process gas is Ar, $O_2$, $N_2$, or $H_2$, or mixed gas thereof for removing organic contamination.

5. The surface treatment apparatus of claim 2, wherein the process gas is reacted gas of $CF_4$, $SF_6$, $Cl_2$, or $CHF_3$ or mixed gas thereof in order to remove metallic or inorganic contaminants.

6. The surface treatment apparatus of claim 2, wherein the neutralizer is a metallic material including Al or Al coated with gold (Au) or a non-metallic conductive material carbon.

7. The surface treatment apparatus of claim 2, further comprising:

an exhaust gas processing unit connected to the vacuum pump and processing noxious gas in exhaust gas.

8. The surface treatment apparatus of claim 7, wherein the exhaust gas processing unit includes a capturing unit for capturing the exhausted noxious gas, and a gas detection sensor provided in an exhaust line of the capturing unit and detecting a concentration of the noxious gas.

9. The surface treatment apparatus of claim 2, wherein the third gas hole includes a resistance section having an inverted conical shape on the top thereof, and a cylindrical vent section extending from the bottom of the resistance section.

10. The surface treatment apparatus of claim 9, wherein a height of the resistance section is longer than the height of the vent section.

11. The surface treatment apparatus of claim 9, wherein the height of the resistance section is equal to or shorter than the height of the vent section.

* * * * *